United States Patent [19]
Nakamura et al.

[11] 3,879,230
[45] Apr. 22, 1975

[54] SEMICONDUCTOR DEVICE DIFFUSION SOURCE CONTAINING AS IMPURITIES AS AND P OR B

[75] Inventors: Masakatsu Nakamura; Toshio Yonezawa; Taketoshi Kato, all of Yokohama; Masaharu Watanabe, Kawasaki; Minoru Akatsuka, Yokohama, all of Japan

[73] Assignee: Tokyo Shibaura Electric Co., Ltd., Kawasaki-shi, Japan

[22] Filed: Sept. 26, 1973

[21] Appl. No.: 400,927

Related U.S. Application Data

[60] Division of Ser. No. 363,132, May 23, 1973, which is a continuation of Ser. No. 78,819, Oct. 7, 1970, abandoned.

[30] Foreign Application Priority Data

| | | |
|---|---|---|
| Feb. 7, 1970 | Japan | 45-10376 |
| Mar. 2, 1970 | Japan | 45-17103 |
| Mar. 13, 1970 | Japan | 45-20826 |
| Mar. 28, 1970 | Japan | 45-25627 |

[52] U.S. Cl. .................. 148/1.5; 148/188; 148/190
[51] Int. Cl. .............................................. H01l 7/00
[58] Field of Search ............. 148/22, 175, 188, 190, 148/1.5; 252/182; 317/235

[56] References Cited

UNITED STATES PATENTS

| | | | |
|---|---|---|---|
| 3,249,831 | 5/1966 | New et al. | 148/190 X |
| 3,260,624 | 7/1966 | Wiesner | 148/175 |
| 3,365,793 | 1/1968 | Nechtow | 148/188 UX |
| 3,437,533 | 4/1969 | Dingwall | 148/187 |
| 3,560,279 | 2/1971 | Havos | 148/188 |
| 3,723,199 | 3/1973 | Vova | 148/175 |

OTHER PUBLICATIONS

Edel et al., "Stress Relief by Counterdoping," IBM Tech. Discl. Bull., Vol. 13, No. 3, Aug. 1970, p. 632.

*Primary Examiner*—L. Dewayne Rutledge
*Assistant Examiner*—J. M. Davis
*Attorney, Agent, or Firm*—Flynn & Frishauf

[57] ABSTRACT

A semiconductor device comprising a high impurity concentration region, the impurity consisting of arsenic and at least one impurity other than arsenic. The number of atoms of the arsenic is smaller than that of the other impurity.

3 Claims, 40 Drawing Figures

SEMICONDUCTOR DEVICE DIFFUSION SOURCE CONTAINING AS IMPURITIES AS AND P OR B

RELATED APPLICATIONS

This application is a division of application Ser. No. 363,132, filed May 23, 1973 which, in turn, is a continuation of application Ser. No. 78,819, filed Oct. 7, 1970, now abandoned, which is the parent of application Ser. No. 263,994, filed June 19, 1972, now U.S. Pat. No. 3,812,519, issued May 21, 1974.

This application is also related to application Ser. No. 76,582, filed Sept. 29, 1970, which matured into U.S. Pat. No. 3,694,707 on Sept. 26, 1972.

This invention relates to semiconductor devices including regions containing impurities at high concentrations and a method of manufacturing such semiconductor devices.

A prior art NPN-type semiconductor device or a high frequency semiconductor device, for example, comprises an N-type conductivity silicon substrate of collector region, a P-type conductivity base region formed by diffusing a P-type conductivity impurity into one surface at the substrate and forming a junction together with the substrate, and an $N^+$-type conductivity emitter region formed by diffusing into the base region an N-type impurity such as phosphorus oxychloride ($POCl_3$).

While, it is desired that the emitter region contains the impurity at high concentrations, diffusion of a large quantity of the impurity for obtaining high concentrations results in such lattice defects as dislocations and segregations. The same problem arises in integrated circuits including many semiconductor elements.

Prior diodes, for example, a $P^+NN^+$-type diode comprises an N-type conductivity silicon substrate, an $N^+$-type conductivity region formed by diffusion at a high concentration, and N-type conductivity impurity into one surface of the substrate, and a $P^+$-type conductivity region formed by diffusing a P-type conductivity impurity into the other surface of the substrate. Such a diode too is required to form the $P^+$-type region by diffusing, at a high concentration, boron nitride (BN), so that lattice defects generally present are in the $P^+$-region. Further in a switching diode, gold is diffused in the surface of the substrate on the side in which the $P^+$-type region has been formed to obtain the diode of the type described above, to decrease the life time whereby to provide a switching time of 1.5 microseconds for example (at $I_F = 10$ mA, $V_R = 10$ V).

The silicon controlled rectifier element (hereinafter abbreviated as SCR) generally comprises an N-type conductivity silicon substrate, a P-type conductivity anode region and a gate region formed by diffusing a P-type conductivity impurity into opposite surfaces of the substrate and an $N^+$-type conductivity cathode region formed by diffusing into the gate region an N-type conductivity impurity such as phosphorus oxychloride ($POCl_3$). When forming the $N^+$-type conductivity cathode region having an increased concentration of the impurity, the number of the lattice defects is also increased to impair the characteristics of the SCR. Thus, in order to decrease the number of lattice defects it is necessary to decrease the concentration of the impurity.

In a circuit element of the NPN construction such as a semiconductor device or an integrated circuit device, in forming the $N^+$-type conductivity region acting as the emitter region, it is important to increase the impurity concentration of that region in order to decrease the noise figure, to improve electrical characteristics and the stability of the circuit element. This is also true in semiconductor devices for high frequency applications. More particularly, when forming diffused regions containing the impurity of the above described type at a high concentration, strains are formed due to compression stress caused by the difference between the tetrahedral radius of silicon atoms of the substrate and the tetrahedral radius of the diffused impurity, such as phosphorus, boron, etc. Moreover, as the concentration of the atoms of the diffused impurity is increased, the impurity tends to precipitate to create strains. These strains cause lattice defects. For this reason, it has been impossible to increase the impurity concentration.

Further, in such circuit elements as high frequency semiconductor devices and integrated circuit devices it is necessary to decrease the base width of such circuit elements, or to decrease the time required for the carriers to pass through the base. In the manufacture of a high frequency semiconductor device, a base region of a given width is formed on one surface of a substrate and then an emitter region is formed in the base region by diffusing an impurity. In such a case, there occurs a phenomenon known as the emitter dip effect (EDE) according to which the width of the base region tends to increase. For this reason, it has been difficult to obtain high frequency semiconductor devices having base regions of sufficiently small width.

Further, in switching diodes of the $PNN^+$ or $P^+NN^+$ construction, as the switching time is reversely proportional to the concentration of the gold diffused, in order to provide constant switching time it is necessary to strictly control the concentration of the gold near the PN junction within limits of ±5%. However, when phosphorus is diffused by utilizing aforementioned phosphorus oxychloride ($POCl_3$), the phosphorus atoms are diffused into the silicon substrate up to the solid solution limit of the phosphorus atoms with the result that a number of segregations and dislocations are formed and the gold deposits in these lattice defects to decrease the number of gold atoms near the PN junction. For this reason, it has been difficult to obtain the desired gold concentration and to produce diodes of constant switching time.

Also in silicon controlled rectifiers it is important to avoid formation of lattice defects in order to prevent decrease in the forward voltage drop and deterioration of various characteristics due to heat hysteresis. With the above described construction, it has been difficult to solve these problems.

It is an object of this invention to provide an improved semiconductor device including a semiconductor substrate formed with a region doped with an impurity at a high concentration without forming segregations or lattice defects in the substrate.

Another object of this invention is to provide a semiconductor device formed with a base region of narrow width without the emitter dip effect.

Still another object of this invention is to provide a novel method of manufacturing a semiconductor device capable of forming a region of the desired impurity concentration without forming segregations or dislocations in the semiconductor substrate.

Yet another object of this invention is to provide a new and improved method of manufacturing a semiconductor device capable of forming an emitter region in the base region without accompanying undesirable emitter dip effect.

According to this invention there is provided a semiconductor device including a region containing impurities at high concentrations wherein the impurities comprise arsenic and at least one impurity other than arsenic and wherein the number of atoms of arsenic is smaller than that of the other impurity at the surface of the region. As a consequence, there is no fear of forming segregations or lattice defects in the region containing impurities, and moreover the above-described emitter dip effect can be avoided where the impurity region is formed to act as the emitter region of a transistor.

In order to more efficiently prevent the formation of segregations and lattice defects it is advantageous to use a (111) face as the main surface of the substrate in which the impurity region is to be formed or to form the substrate to have dislocation free crystal structure. The emitter dip effect can be more efficiently prevented when the amount of arsenic to the impurity other than arsenic is selected to be equal to 3–40 percent or more, preferably 8–24 percent, in the atom ratio at the surface of the high concentration region. The term "atom ratio" denotes a ratio of the number of atoms per cubic centimeter.

The invention will be better understood from the following description, reference being made to the accompanying drawings, in which:

FIGS. 6A to 6D are photographs of semiconductor substrates of this invention and prior art taken by X-ray topography to show the presence of lattice defects wherein FIGS. 6A and 6B show prior art devices, FIG. 6C a device manufactured by a method similar to this invention but the ratio of arsenic to phosphorus is an outside of the scope of this invention and FIG. 6D shows the novel device.

Figure 9A:
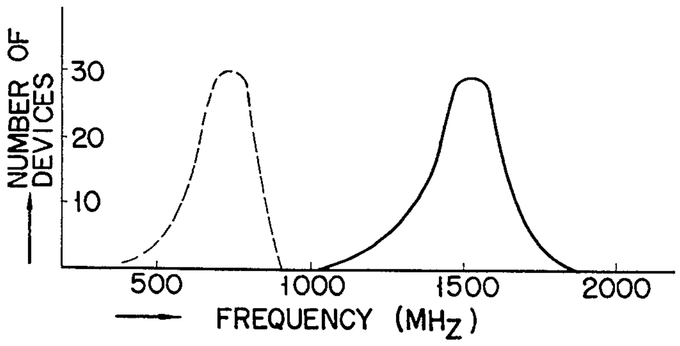
Figure 9B:
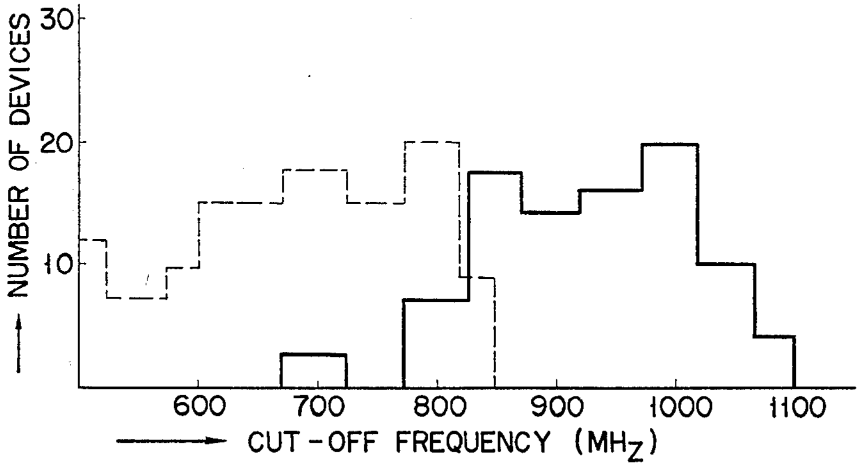
Figure 9C:
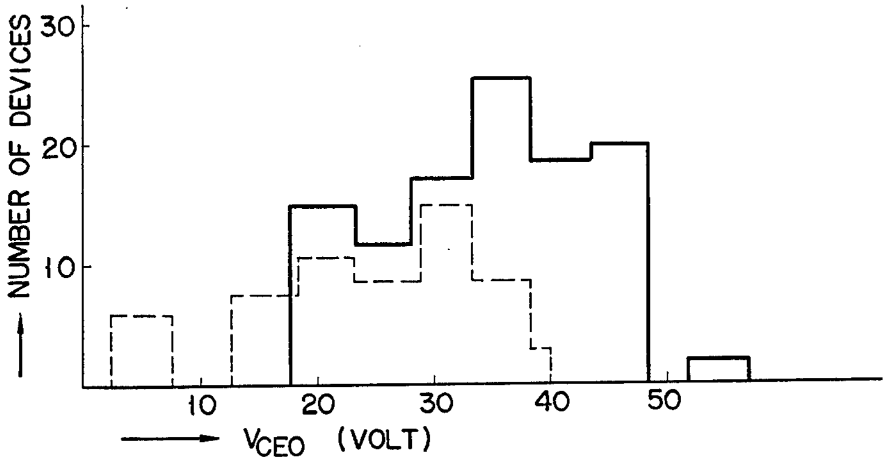
Figure 10:
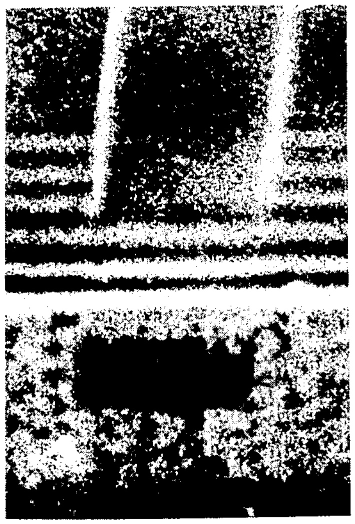
Figure 11:
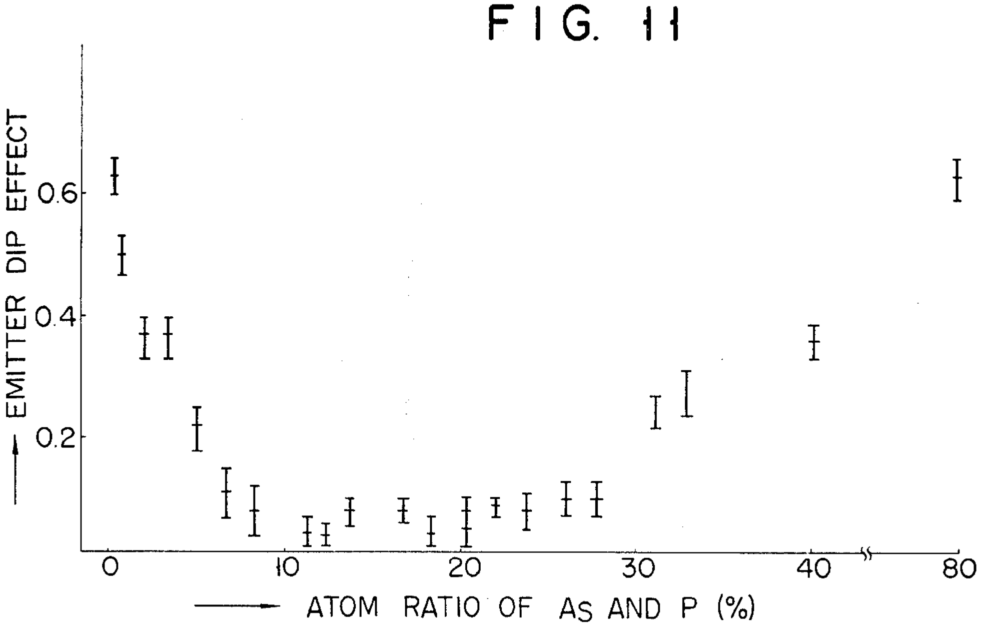
Figure 12:
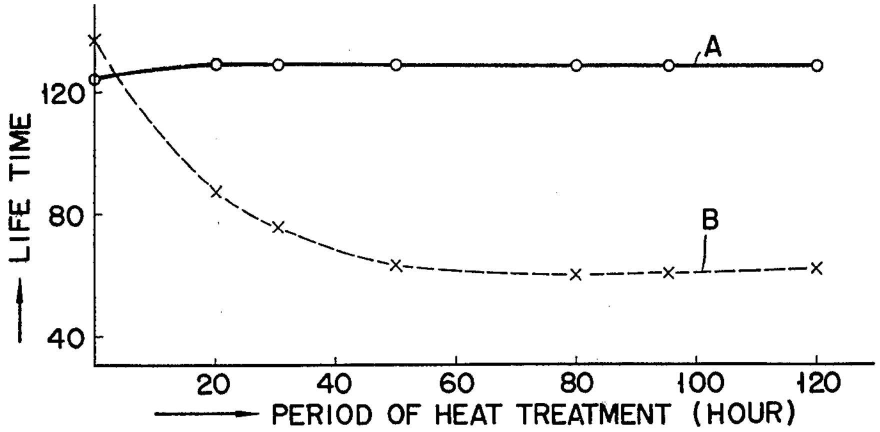
Figure 13:
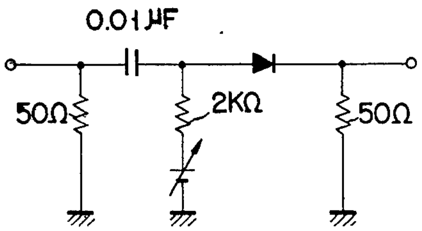
Figure 14:
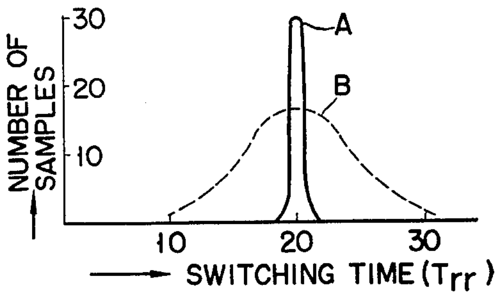
Figure 15A:
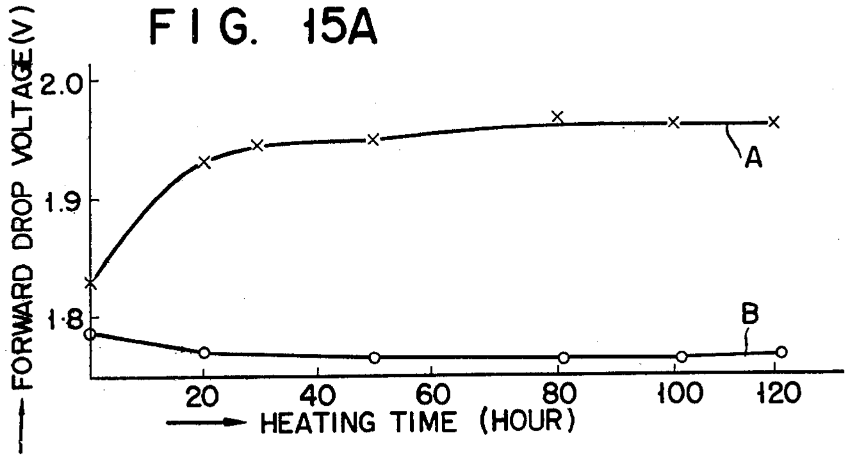
Figure 15B:
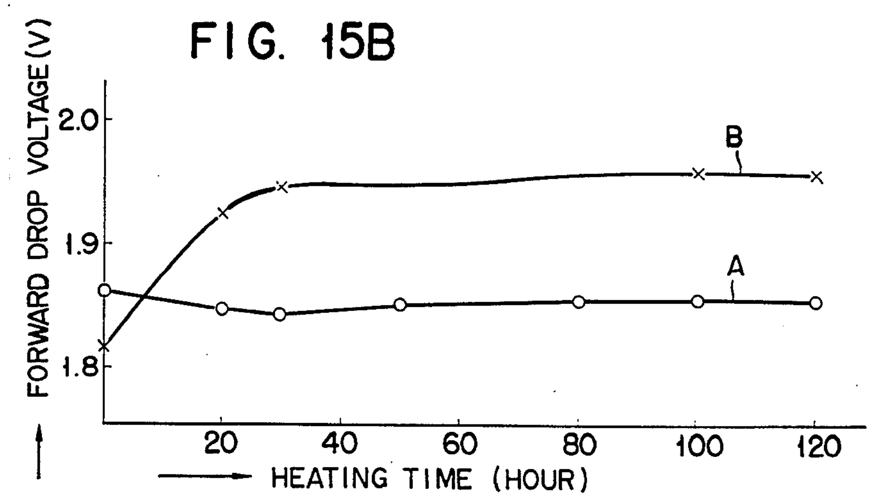
Figure 16:
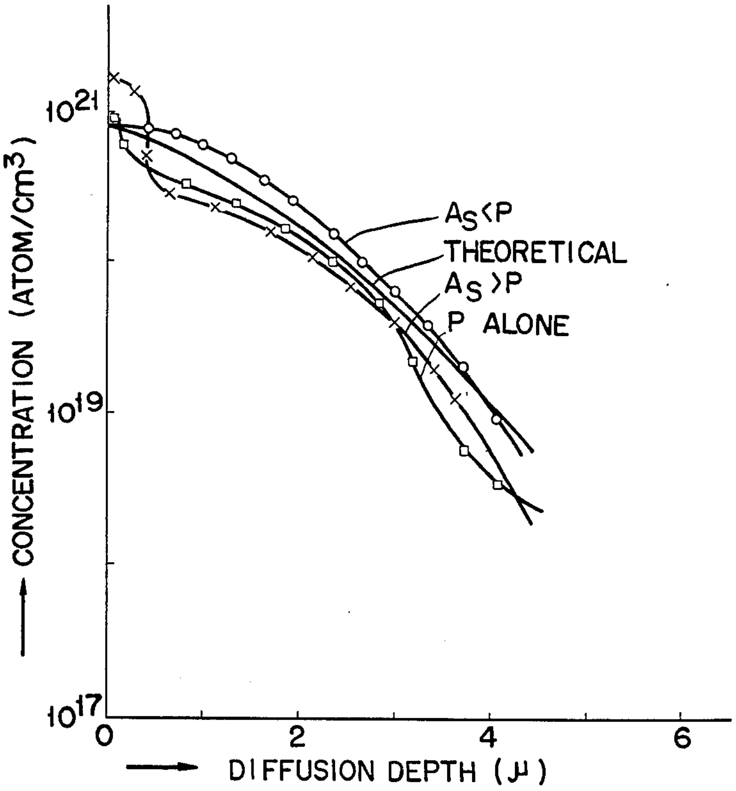

FIGS. 9A to 9C compare various characteristics of a novel high frequency transistor and of a prior art high frequency transistor wherein FIGS. 9A and 9B show cut off frequency characteristics, and FIG. 9C the $V_{CEO}$ characteristics, and wherein in the cases of FIGS. 9B and 9C the surfaces of the substrates are (111) faces;

FIG. 10 is a photograph of a novel high frequency transistor which shows that no emitter dip effect is present;

FIG. 11 is a graph to show the relationship between the ratio of arsenic to phosphorus and the emitter dip effect;

FIG. 12 is a graph to show the relationship between the time of heat treatment and the life times of a novel diode and a conventional diode;

FIG. 13 is a circuit diagram of a circuit employed to measure the switching time of a switching diode;

FIG. 14 compares the switching times of a novel switching diode and of a prior art switching diode;

FIGS. 15A and 15B show the relationship between the heat treatment time and forward voltage drop of a novel silicon controlled rectifier and of a prior art silicon controlled rectifier wherein in the case of FIG. 15A, a dislocation free substrate is used whereas in the case of FIG. 15B a (111) face is used as the surface of the substrate; and FIG. 16 compares a theoretical curve with impurity concentration curves in the diffused regions of a novel device and a prior device.

Figure 1A:
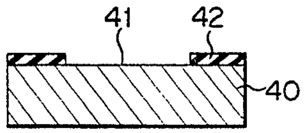
FIGS. 1A to 1D are sectional views showing various steps of manufacturing an NPN-type planar transistor according to the present invention.
Figure 1B:
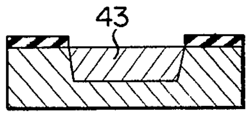
Figure 1C:
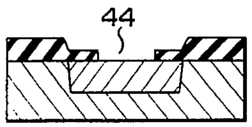
Figure 1D:
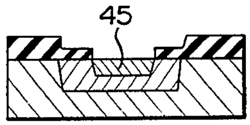
Figure 2:
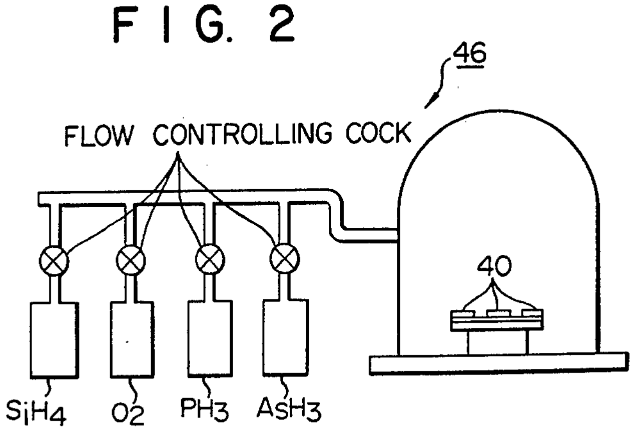
FIG. 2 is a diagram showing apparatus suitable for use in the manufacture of the transistor shown in FIGS. 1A to 1D.

With reference first to FIGS. 1A to 1D, the novel method of manufacturing an NPN-type planar transistor will be described hereunder. A silicon dioxide film 42 is applied onto one surface 41, preferably of a (111) face, of an N-type conductivity silicon substrate 40 free from dislocation as shown in FIG. 1A, and an opening is formed in the film 42 by photoetching technique. A P-type impurity is diffused into the substrate through this opening to form a P-type conductivity region 43 thus forming a PN-junction between the substrate 40 and the region 43, as shown in FIG. 1B. In the planar transistor, the substrate 40 acts as a collector region and the P-type region 43 as a base region. A silicon dioxide film is then applied onto the surface 41 and an opening 44 is formed in this silicon dioxide film at the center of the base region as shown in FIG. 1C. Then a gaseous mixture containing a mixture of silane ($SiH_4$) and oxygen, and, at a predetermined ratio to be described later, a mixture of hydrogen phosphide ($PH_3$) and hydrogen arsenide ($AsH_3$) are applied on the exposed surface of the substrate through opening 44 by using a suitable apparatus as diagrammatically shown in FIG. 2 to deposit a silicon dioxide film doped with phosphorus and arsenic on the exposed portion of the region 43, as shown in FIG. 1D.

The concentrations of respective impurities to be doped can be adjusted to any desired values by controlling the flow quantities of the hydrogen phosphide and hydrogen arsenide utilized to form the silicon dioxide film doped with these impurities. Accordingly, the flow quantities of the hydrogen phosphide and hydrogen arsenide are adjusted such that the quantity of arsenic in the doped region is smaller than that of the other impurity (phosphorus in this case), in other words, in terms of the numbers of atoms, the amount of arsenic being 3–40 percent or preferably 8–24 percent of the amount of the other impurity.

Then the substrate is heat treated in a nitrogen atmosphere at a temperature of about 1,100°C. for 4 hours to diffuse the impurities in the silicon dioxide film into the P-type region 43 to form an $N^+$ region 45 acting as an emitter region. In the semiconductor device prepared as above described, the ratio of the extent of the broadening of the base width caused by the emitter dip effect to the base width is less than $0.2\mu$ which is, of course, negligbly small. When the $N^+$ ratio is formed by diffusing an ordinary N-type impurity, for example, phosphorus oxychloride ($POCl_3$) into a monocrystalline substrate prepared by a pull-up growing method as has been the common prior practice, and as the surface concentration is increased to about $2.0 \times 10^{20}$ atoms/$cm^3$, the dislocation and segregation become significant. For this reason, it has been impossible to increase the impurity concentration to the desired level. Whereas, when arsenic is incorporated into the doped region at a prescribed ratio according to the teaching of this invention, even when the surface concentration is increased to $4.0 \times 10^{20}$ atoms/$cm^3$ any lattice defect and segregation cannot be noted.

While in the foregoing description, doped oxide method has been used to diffuse impurities to form the $N^+$ region, it is also possible to diffuse the impurities into the substrate by heating it together with sources of impurities in an opened or sealed tube. When using a sealed tube, sources of impurities may be suitable combinations of phosphorus pentaoxide, phosphorus silicide, red phosphorus, silicon arsenide, arsenide and so forth. The type of the combination and the quantity of the source sealed in the tube are selected to produce the above-described ratio of the impurities in the diffused region. A suitable combination of the source comprises red phosphorus and silicon arsenide. Further in the above example, phosphorus was illustrated as the impurity other than arsenide, but it will be clear that impurities of the same conductivity type, such as antimony, can also be used. Although doping only antimony into the substrate results in the dislocation, addition of arsenic prevents the generation of dislocation. In addition to the formation of an $N^+$-region of high concentration of an NPN-type semiconductor device, the method of this invention is also applicable to form a $P^+$ region of high impurity concentration to manufacture a PNP-type semiconductor device. In this case also the ratio of arsenic to the other impurity, e.g. phosphorus contained in the diffused region should be the prescribed ratio described above, more particularly in terms of the number of atoms the arsenic should amount to 3–40%, preferably 8–24%.

Figure 3A:
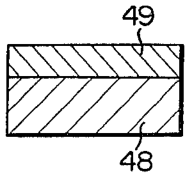
FIGS. 3A to 3E are sectional views showing various steps of manufacturing a modified PNP-type planar transistor.
Figure 3B:
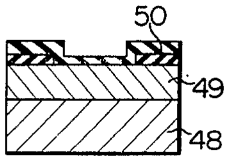
Figure 3C:
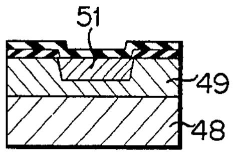
Figure 3D:
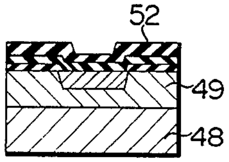
Figure 3E:
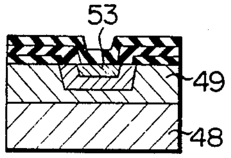

FIGS. 3A to 3E show successive steps of manufacturing a PNP-type semiconductor device according to the method of this invention. On one surface of a $P^+$-type silicon substrate 48 deeply doped with boron is formed a P-type region 49 by vapour phase growth technique as shown in FIG. 3A, and a silicon dioxide film is applied on the region 49. An opening is formed in the silicon dioxide film. A gaseous mixture of hydrogen phosphide ($PH_3$) and hydrogen arsenide ($AsH_3$) containing phosphorus and arsenic at a ratio of 100 : 8–24, in terms of the number of atoms, is used to form a doped oxide layer 50 on the silicon dioxide film and on the area of the region 49 exposed in the opening whereby to diffuse phosphorus and arsenic in the P-type region, thus forming an N-type region 51 acting as a base region as shown in FIG. 3C. Then, a 50 : 1 gaseous mixture of boron hydride ($B_2H_6$) and hydrogen arsenide ($AsH_3$) is admitted into an opened tube diffusing apparatus to form an oxide film 52 doped with boron and arsenic on the silicon dioxide film and the N-type region 51, as shown in FIG. 3D. The assembly is then heated for 1.5 hours at a temperature of about 1,100°C. to diffuse boron and arsenic into the N-type region 51 to form a $P^+$-type region 53 acting as an emitter region, as shown in FIG. 3E. Under these conditions, it is possible to form an emitter region having a surface concentration of $3 \times 10^{20}$ atoms/$cm^3$ and a thickness of 3 microns. The use of the oxide film doped with arsenic caused the generation of little stress in the film.

Figure 4A:
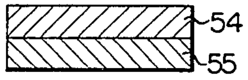
FIGS. 4A to 4D show sectional views of successive steps of manufacturing a diode according to the method of this invention.
Figure 4B:
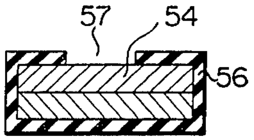
Figure 4C:
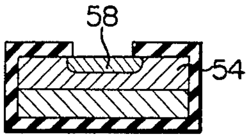
Figure 4D:
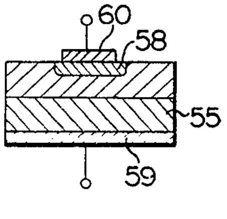

FIGS. 4A to 4D show successive steps of manufacturing a diode according to the method of this invention. Thus, arsenic and at least one N-type conductivity impurity other than arsenic are diffused into the opposite surfaces of an N-type conductivity silicon substrate 54 to form $N^+$-type conductivity regions 55 on both sides thereof and then one of the $N^+$-type regions is removed as shown in FIG. 4A. In this case, the quantity of the arsenic diffused in the $N^+$-type conductivity region is determined with respect to the quantity of the N-type conductivity impurity other than arsenic to have a value within a range of 8–24% in terms of the number of atoms. Then all surfaces of the substrate are covered with a silicon dioxide film 56 and at least one P-type conductivity impurity and arsenic are diffused into the substrate 54 at a definite ratio through an opening 57 formed in the silicon dioxide film to form a $P^+$-type conductivity region 58 in the substrate 54 as shown in FIG. 4C. Again the quantity of the arsenic diffused in the $P^+$-type conductivity region is determined with respect to the quantity of the P-type conductivity impurity to have a value within a range of 8–24% in terms of the number of atoms. Then the silicon dioxide film 56 is removed and an anode electrode 60 and a cathode electrode 59 are secured to the $P^+$ region 58 and the $N^+$ region 55, respectively, to complete a diode, as shown in FIG. 4D. It was possible to increase the impurity concentrations in the diffused regions fabricated in the manner as above described to a high value of $7.5 \times 10^{20}$ atoms/$cm^3$, for example, and the fact that there is no lattice defect in the diffused regions was confirmed by X-ray photography.

Figure 5A:
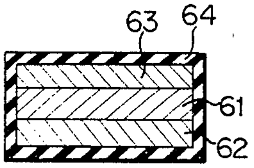
FIGS. 5A to 5D are similar views showing successive steps of manufacturing a silicon controlled rectifier.
Figure 5B:
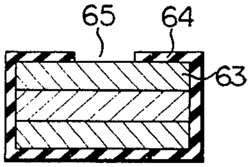
Figure 5C:
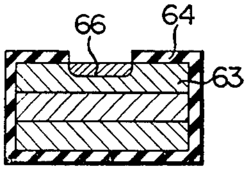
Figure 5D:
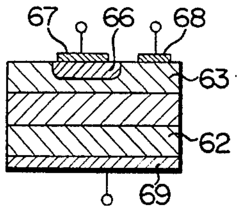

FIGS. 5A to 5D illustrate successive steps of manufacturing a silicon controlled rectifier. Again, arsenic and at least one P-type conductivity impurity are diffused into the opposite surfaces of an N-type conductivity silicon substrate 61 at a definite ratio to form P-type conductivity regions 62 and 63 on the opposite sides of the substrate. The quantity of the arsenic diffused in the P-type conductivity regions is determined with respect to the quantity of the P-type conductivity impurity to have a value within a preferred range of 8–24%, in terms of the number of atoms. Then, the entire surface of the substrate is covered with a silicon dioxide film 64 as shown in FIG. 5A and an opening 65 is formed through the portion of the silicon dioxide film 64 overlying one of the P-type conductivity regions 63 as shown in FIG. 5B. Arsenic and at least one N-type conductivity impurity other than arsenic are diffused through opening 65 at a definite ratio to form an $N^+$-type conductivity region 66 in one of the P-type conductivity regions 63, as shown in FIG. 5C. The quantity of the arsenic diffused in the N-type conductivity region 66 is determined with respect to the quantity of the N-type conductivity impurity to have a value within a preferred range of 8–24%, in terms of the number of atoms. After removal of the silicon dioxide film 64, metal films are vapour deposited on the $N^+$-type region 66, the portion of the P-type region 63 adjacent thereto and the other P-type region 62 respectively to form a cathode electrode 67, a gate electrode 68 and an anode electrode 69 whereby to complete a silicon controlled rectifier, as shown in FIG. 5D.

While the semiconductor devices illustrated hereinabove utilized silicon substrates formed by a conventional method, a floating zone process, for example, the merit of this invention can be enhanced when use is made of the so-called dislocation free silicon substrate. The term "dislocation free silicon" used herein means a silicon body having a dislocation density of less than 1,000 $cm^{-3}$. Such a silicon body may be produced by a method disclosed in Japanese patent publication No. 18,402 of 1965 relating to an improvement of the floating zone method or the pedestal pulling method described in Applied Physics, 31, 736 (1930). According to the latter method a silicon body is mounted on a pedestal provided with slits for preventing flow of high frequency current and the silicon body is melted in an inert atmosphere in vacuum by means of high frequency induction heating. Then an extremely fine seed crystal is dipped in the molten silicon and the seed crystal is pulled upwardly while being rotated thus growing a pure crystal of silicon.

Not only silicon but also the other semiconductors such as germanium can also be used in the form of dislocation free crystals.

We have confirmed by experiments that defects of the crystals such as lattice defects and segregations caused by diffusing impurities into the substrate are also influenced by the orientations of the crystals on the surface of the substrate. We have also found that use of the (111) face as the main surface or the surface to be diffused with impurities minimizes the creation of such defects. For this reason, in the above-described examples the (111) faces were selected as the main surfaces of the substrates.

Table 1 below shows measured values of the defect density of various semiconductor devices prepared according to the method of this invention and utilizing different crystal faces as the main surfaces of the substrates.

Table 1

| Crystal face | Surface concentration atoms/cm³ | Defect density | Conclusion |
|---|---|---|---|
| (111) | $1.2 \times 10^{21}$ | ≈0 | good |
| (100) | $1.3 \times 10^{21}$ | numerous | bad |
| (110) | $1.2 \times 10^{21}$ | do. | do. |
| (311) | $1.1 \times 10^{21}$ | many | not good |
| (211) | $1.1 \times 10^{21}$ | numerous | bad |
| (811) | $1.2 \times 10^{21}$ | do. | do. |
| (411) | $1.2 \times 10^{21}$ | do. | do. |
| (210) | $1.2 \times 10^{21}$ | many | do. |
| (322) | $1.3 \times 10^{21}$ | numerous | do. |
| (320) | $1.2 \times 10^{21}$ | do. | do. |

In the above table, dislocation free silicon substrates were used as the semiconductor substrates and the impurities were diffused by utilizing silicon dioxide films doped with phosphorus and arsenic at a predetermined ratio.

According to a prior method, defects are formed when the surface concentration in the diffused region in the substrates exceeds $8 \times 10^{21}$ atoms/cm³, but in the semiconductor devices prepared by the method of this invention and utilizing the (111) faces as the main surfaces, the defect density can be reduced to substantially zero as shown in Table 1.

Figure 6A:
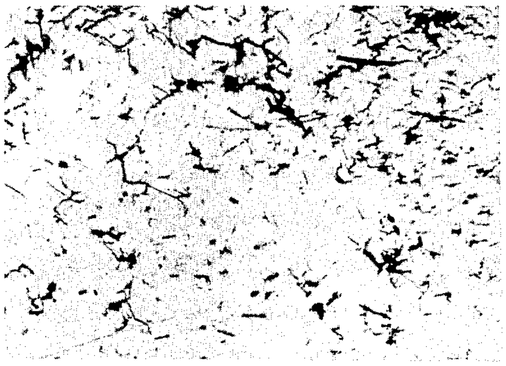
Figure 6B:
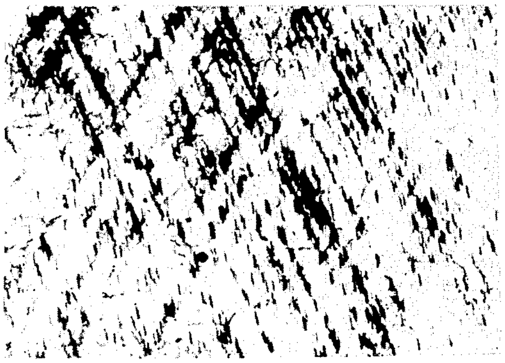
Figure 6C:
Figure 6D:
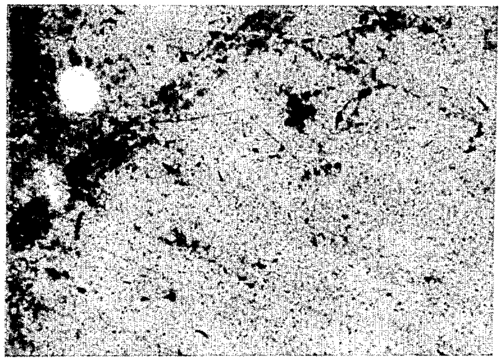

FIGS. 6A to 6D show photographs of the substrate surfaces diffused with impurities according to this invention and to a prior method and taken by X-ray photography. The substrates utilized comprised N-type conductivity silicon crystals having a dislocation density of 5,000 to 6,000 $cm^2$ and a specific resistivity of 1–2 ohms-cm and their (111) faces were utilized as the main surfaces. FIG. 6A shows a photograph of a substrate diffused with only arsenic by the prior method and containing many defects which are shown as black spots and stripes. FIG. 6B shows a photograph of a substrate diffused with only phosphorus by the prior method also containing a great many defects. FIG. 6C shows a photograph of the main surface of a substrate doped with both arsenic and phosphorus like the semiconductor device of this invention but the ratio of arsenic to phosphorus is 150 : 100, in terms of the number of atoms which is outside the scope of this invention. The substrate contains many defects. FIG. 6D shows a photograph of a substrate doped with arsenic phosphorus at a ratio of 3 to 6 : 100 in terms of the number of atoms. In this case, the number of defects is extremely small.

Figure 7A:
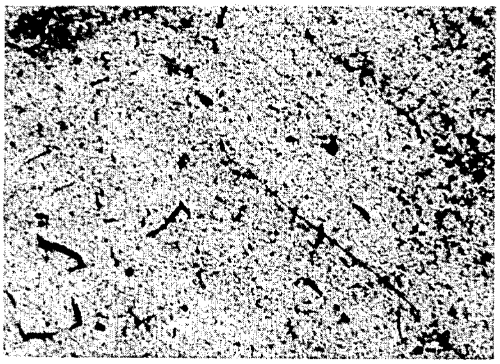
FIGS. 7A to 7E are photographs taken by X-ray topography to show the effect of the dislocation density of the substrate upon lattice defects.
Figure 7B:
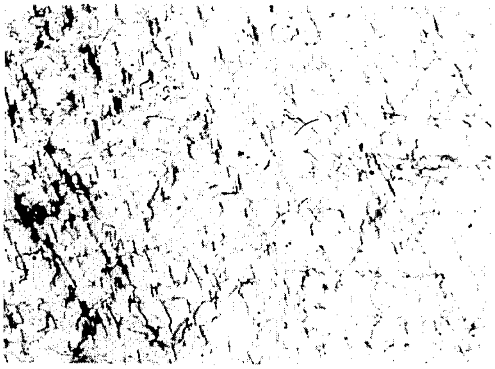
Figure 7C:
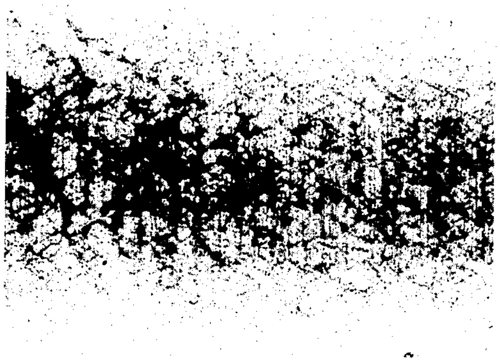
Figure 7D:
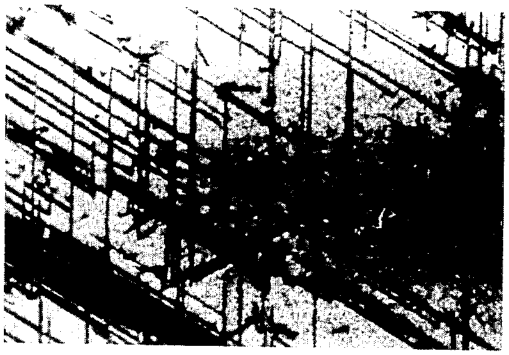
Figure 7E:

FIGS. 7A to 7C show photographs of silicon substrates of different dislocation densities. These photographs show the relationship between the dislocation density and the creation of the defects. FIGS. 7A to 7C show photographs of substrates having dislocation densities of more than 1,000 $cm^{-2}$, equal to 2,000–5,000 $cm^{-2}$ and more than 10,000 $cm^{-2}$ and diffused with phosphorus into the (111) faces thereof to provide a surface density of $4 \times 10^{20}$ $cm^{-3}$ each. These figures show that the number of defects formed increases in proportion to the dislocation density of the substrates. FIGS. 7D and 7E show photographs of silicon substrates having dislocation densities of more than 2,000 $cm^{-2}$ and less than 1000 $cm^{-2}$, respectively, and are diffused with arsenic and phosphorus at a ratio of 8 – 24 : 100, in terms of the number of atoms, to a surface density of $7 \times 10^{20}$ $cm^{-3}$. As can be clearly noted from FIGS. 7A to 7E, the number of defects formed decreases with the dislocation density of the substrate and becomes lesser when both phosphorus and arsenic are used at a definite ratio than when either one of these impurities is used alone.

When arsenic and at least one impurity other than arsenic are diffused together in the substrate in accordance with this invention at a ratio such that the number of atoms of arsenic is less than that of the other impurities, it is possible to greatly decrease the number of lattice defects formed as shown in Table 2 below.

Table 2

| Surface concentration (atom/cm³) phosphorus arsenic | Ratio of phosphorus to arsenic (in terms of the number of atoms) | Type of substrate | Surface density (atoms/cm³) | Curvature ($m^{-1}$) | Thickness of diffused layer (μ) |
|---|---|---|---|---|---|
| 0  $2.0\times10^{20}$ | 0 : 100 | *C.Z substrate | $2.0\times10^{20}$ | 0 | 1.22 |
| $7.2\times10^{20}$ $0.4\times10^{20}$ | 100 : 5.56 | do. | $7.6\times10^{20}$ | $-1.55\times10^{-3}$ | 4.7 |
| $3.8\times10^{20}$  0 | 100 : 0 | do. | $3.8\times10^{20}$ | $1.92\times10^{-2}$ | 4.0 |

Table 2 – Continued

| Surface concentration (atom/$cm^3$) phosphorus | arsenic | Ratio of phosphorus to arsenic (in terms of the number of atoms) | Type of substrate | Surface density (atoms/$cm^3$) | Curvature ($m^{-1}$) | Thickness of diffused layer ($\mu$) |
|---|---|---|---|---|---|---|
| $6.7\times10^{20}$ | $0.3\times10^{20}$ | 100 : 4.48 | **dislocation free substrate | $7.0\times10^{20}$ | $-3.44\times10^{-4}$ | 3.8 |
| $4.0\times10^{20}$ | 0 | 100 : 0 | do. | $4.0\times10^{20}$ | $-1.03\times10^{-3}$ | 4.0 |

*C.Z substrate means a silicon substrate prepared by Czochralski melting zone method which generally has a high dislocation density.
**The dislocation free substrate means a silicon substrate having a dislocation density of less than $1000^{-2}$ and prepared by the pedestal pulling method.

This table shows that, in substrated doped with both phosphorus and arsenic at a ratio of 100 : 4.48 or 100 : 5.56 it is possible to form regions of higher impurity concentrations than when only phosphorus or arsenic is diffused and that the curvature of the substrate is smaller or the substrate does not warp appreciably when compared with the case in which only phosphorus is doped.

While it has been known in the art to simultaneously diffuse an impurity having a larger lattice constant than silicon, for example, tin (Sn) and an impurity having a smaller lattice constant than silicon, such as phosphorus (P) or boron (B) for the purpose of decreasing diffusion strain, it should be noted that the invention is quite different fron such a method. When selectively diffusing the above-described combination of tin and phosphorus or a combination of tin and boron, the presence of tin interferes with the selective diffusion of the silicon dioxide film thus resulting in the diffusion of boron or phosphorus through the silicon dioxide film. It is also difficult to simultaneously diffuse tin and phosphorus, boron and phosphorus or tin and boron.

In contrast, in the method of utilizing arsenic, the diffusion proceeds readily. Especially, when using a combination of phosphorus and arsenic, since these impurities are both N-type, it is possible to increase the surface concentration more than in the case wherein only phosphorus is diffused.

Following examples are given by way of illustration but not limitation.

1. NPN-Plander Type Semiconductor Device.

Figures 8A, 8B:
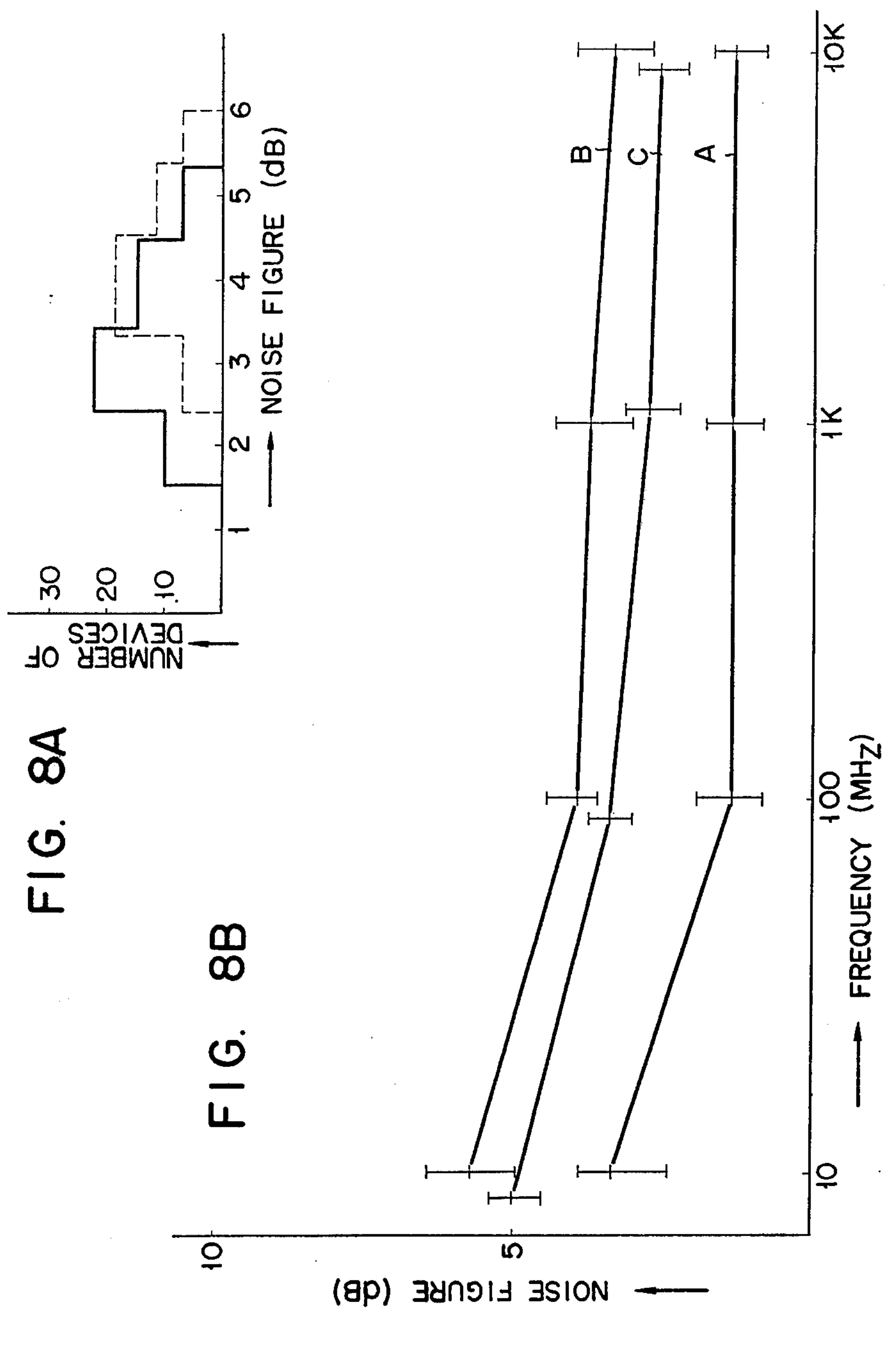
FIG. 8A shows a graph to compare the noise figure of a novel NPN-type planar transistor with that of a prior similar transistor.
FIG. 8B shows a graph to show the relationship between the noise figure and the frequency of transistors utilizing different crystal surfaces.

Boron nitride (BN) was diffused into one surface of a dislocation free N-type conductivity silicon substrate having a specific resistivity of 4 ohm-cm to form a base region. The emitter region was formed by diffusing an impurity mixture of phosphorus and arsenic to a surface concentration of 4 × $10^{20}$/$cm^3$ by means of the doped oxide coating method of complete a semiconductor device for audio frequency use. The noise figure of this semiconductor device was compared with that of a similar semiconductor device comprising a silicon substrate prepared by the conventional pull-up method and diffused with impurities in the same manner. FIG. 8A shows this comparison wherein the solid lines show the noise figure of the device, whereas the dotted lines that of the conventional device. As shown by the solid lines, the semiconductor device has an extremely low noise figure of 1 dB at a frequency of 120 Hz and at a rating of 6 V, 1 mA and 500 ohms, for example. FIG. 8B shows noise figures of NPN-type transistors utilizing substrates having main surfaces of the crystal faces of the orientations of (111) face (curve A), (100 face (curve B) and (311) face (curve C), respectively.

2. Semiconductor Device for High Frequency Use.

A mixture of phosphorus and arsenic containing the latter at a ratio of 8–24% in terms of the number of atoms was doped into a main surface of a dislocation and oxygen free N-type conductivity silicon substrate having a specific resistivity of 4 ohm-cm, to form an emitter region of a surface concentration of 4 × $10^{20}$/$cm^3$ by means of the above-described doped oxide coating method to obtain a transistor for high frequency use. A similar transistor was formed by using a silicon substrate prepared by the conventional pull-up method but diffused with impurities in the same manner just described. As shown by the solid lines in FIG. 9A, the average value of the cut-off frequency of the semiconductor devices was about 1,500 MHz, whereas that of the conventional semiconductor device was about 700 MHz as shown by the dotted lines in FIG. 9A. In high frequency semiconductor devices, although it is necessary to decrease the base width in order to improve the high frequency characteristics, this tends to decrease the emitter-collector breakdown voltage $V_{CEO}$. However, in the semiconductor devices of this invention, utilizing dislocation free substrates, such decrease in $V_{CEO}$ is not noted and yet $V_{CEO}$ is higher by about 15 volts than conventional overlay transistors.

While in the above-described examples dislocation free monocrystalline substrates were used, when a (111) face was used, results as shown in FIGS. 9B and 9C were obtained. As shown by the dotted line curve shown in FIG. 9B, according to the prior method, it was impossible to obtain semiconductor devices having cut-off frequencies of more than 900 MHz, but according to this invention, it is possible to produce semiconductor devices having higher cut-off frequencies of 900 to 1,000 MHz, as shown by the solid lines. FIG. 9C compares the distribution of values of $V_{CEO}$ (a dc voltage between collector and emitter electrodes when the base electrode is opened) of the semiconductor devices utilizing the (111) face and are fabricated by the method of this invention (solid lines), and of the semiconductor devices prepared by the conventional method (dotted lines). FIG. 9C shows that the semiconductor devices have larger and more stable $V_{CEO}$. As can be noted from the photograph shown in FIG. 10 it is is possible to readily provide the desired base width because of the absence of the emitter dip effect, thus improving the high frequency characteristics.

According to the method of this invention, there is not tendency of increasing the base width caused by the emitter dip effect as in the conventional semiconductor devices. FIG. 11 shows a diagram to explain the relationship between the ratio of base width to the emitter dip and the ratio of arsenic to phosphorus. FIG. 11 clearly shows that a range from 8 to 24% of As/P provides the minimum value of less than 0.15, of the ratio of the base width to the emitter dip and range from 3 to 40% of As/P causes a relatively smaller emitter dip effect. This preferred range was confirmed by determining a range in which creation of the defects (which are believed to be caused by the precipitation of phosphorus) is remarkably reduced, by means of X-ray topography. The exact theory for this is not yet clearly understood, and it is considered that the precipitation of phosphorus is prevented by the presence of arsenic. For this reason, base widths exactly the same as the designed values, for example, one micron or less, can be readily assured, thus producing at high yields high frequency semiconductor devices having cut-off frequencies of more than 1,000 MHz.

When fabricating a semiconductor device, or an integratd circuit device having a plurality of mutually insulated circuit elements adjacent one main surface of a semiconductor substrate, it is possible to form junction regions of small widths, because, in the steps of forming diffused layers of the PN junctions of the circuit elements, the $N^+$ or $P^+$ regions can be formed to have high concentrations without forming lattice defects and because the width of the regions adjacent the $N^+$ or $P^+$ regions is not broadened by the emitter dip effect during the formation of the high concentration regions. Thus, similar to the above-described NPN-type semiconductor devices and diodes, it becomes possible to obtain at high yields integrated circuits having circuit elements of improved noise and high frequency characteristics.

3. Diode.

When forming a diffused region of a high impurity concentration in a dislocation free semiconductor substrate for the purpose of obtaining a diode, since, according to this invention, an impurity incorporated with arsenic is diffused therein, no defect due to diffusion strain is formed in the region. Accordingly, the impurities will not precipitate in the defects but are maintained in a supersaturated state, thus manifesting electrical activity. Thus, for example, even when a large mesa type diode is heat treated at a temperature of 100° to 300° C. over a long time, the life time is not affected. FIG. 12 is a graph to compare the relationship between the life time and the period of heat treatment of the diode prepared according to the method of this invention (solid line curve A) and of the diode of the prior art (dotted line curve B). The same advantage can also be obtained by a diode utilizing the (111) face as the main surface. In a switching diode, since there is no lattice defect in the layer containing impurities at a high concentration, the segregation of gold will not occur. For this reason, it is possible to readily control the concentration of gold near the PN-junction thus decreasing deviations of the switching time from the reference value. Generally, the measurement of the switching time Trr is made by using a circuit as shown in FIG. 13. Typical results of the measurement are shown in FIG. 14 as shown by the dotted curve B, prior art switching diodes show an average switching time of 2.0 $\mu$ sec and maximum deviation of 1 $\mu$ sec whereas those of this invention show an average of 2.0 $\mu$ sec and maximum deviation of only 0.03 $\mu$ sec as shown by solid line curve A which shows that the switching diodes have uniform characteristics.

4. Silicon Controlled Rectifiers.

FIGS. 15A and 15B show graphs to compare the relationship between the forward voltage drop and the heat treatment time of the silicon controlled diodes prepared according to this invention (curves A) and of those of the prior art (curves B). FIG. 15A shows the characteristics of the silicon controlled rectifiers utilizing dislocation free substrates whereas FIG. 15B those utilizing the (111) faces as the main surface. By comparing curves A and B, it will be clear that the forward voltage drop of the silicon controlled rectifiers is lower than that of the prior art which is the desirable characteristic.

Curves shown in FIG. 16 show impurity distributions in a region formed by diffusing a lesser quantity of arsenic than phosphorus, in a region containing a larger quantity of arsenic than phosphorus, and in a region containing phosphorus alone. The upper most curve shows that the region formed by the method has the most uniform concentration of the impurities. As above described, according to this invention, arsenic and at least one impurity other than arsenic are diffused into a semiconductor substrate to form a region containing the impurities at a high concentration and free from any lattice defects, thus producing a semiconductor device of a greatly decreased noise figure and of improved breakdown voltage $V_{CEO}$ between the emitter and collector electrodes. Moreover as the broadening of the base width is effectively prevented, it is possible to increase the cut off frequency of the semiconductor device for high frequency application. Further, in accordance with this invention it is possible to decrease the deviation in the switching time of a switching diode and to decrease the forward voltage drop of a silicon controlled rectifier due to heat treatment. The novel method can also be applied to integrated circuits with equal advantage.

We claim:

1. Semiconductor diffusion source for use in manufacturing a semiconductor device having a semiconductor substrate to form a highly doped surface region in said substrate of said semiconductor device, said source comprising:

a. a first component phosphorus or boron; and b. a second component of arsenic to compensate for a lattice strain caused by said first component when said first component is diffused as an impurity into a semiconductor substrate said first and second components being in amounts such that the concentration of the second impurity is smaller than that of the first impurity at the surface of said highly doped surface region.

2. Semiconductor diffusion source of claim 1, wherein said surface region has one conductivity type and said semiconductor substrate is a silicon semiconductor substrate having an opposite conductivity type.

3. Semiconductor diffusion source of claim 1, wherein said surface region comprises an emitter surface region of a transistor.

* * * * *